United States Patent
Grodzki et al.

(10) Patent No.: US 11,709,215 B2
(45) Date of Patent: Jul. 25, 2023

(54) DEVICE AND METHOD FOR ACTIVE LOCAL SUPPRESSION OF RECEPTION IN MAGNETIC RESONANCE RECORDINGS

(71) Applicant: Siemens Healthcare GmbH, Erlangen (DE)

(72) Inventors: David Grodzki, Erlangen (DE); Rainer Schneider, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 27 days.

(21) Appl. No.: 17/376,126

(22) Filed: Jul. 14, 2021

(65) Prior Publication Data

US 2022/0018919 A1 Jan. 20, 2022

(30) Foreign Application Priority Data

Jul. 15, 2020 (DE) ...................... 10 2020 208 816.0

(51) Int. Cl.
   *G01R 33/38* (2006.01)
   *G01R 33/385* (2006.01)
   *G01R 33/36* (2006.01)

(52) U.S. Cl.
   CPC ..... *G01R 33/3854* (2013.01); *G01R 33/3614* (2013.01)

(58) Field of Classification Search
   CPC ............ G01R 33/3854; G01R 33/3614; G01R 33/36; G01R 33/5659
   See application file for complete search history.

(56) References Cited

U.S. PATENT DOCUMENTS

| | | | |
|---|---|---|---|
| 7,525,314 B1* | 4/2009 | Heiland | H01J 37/02 324/318 |
| 2017/0108569 A1* | 4/2017 | Harvey | G01R 33/36 |
| 2020/0249292 A1* | 8/2020 | Biber | G01R 33/3692 |

FOREIGN PATENT DOCUMENTS

| | | |
|---|---|---|
| WO | 9850798 A1 | 11/1998 |
| WO | 2019068687 A2 | 4/2019 |

OTHER PUBLICATIONS

German Office Action for German Application No. 10 2020 208 816.0 dated Apr. 14, 2021.

* cited by examiner

*Primary Examiner* — G. M. A Hyder
(74) *Attorney, Agent, or Firm* — Lempia Summerfield Katz LLC

(57) ABSTRACT

A magnetic resonance tomography scanner with a noise suppressor for suppressing interferences of reception and a method for operation of the magnetic resonance tomography scanner are provided. The noise suppressor receives an interference signal with a sensor, determines a noise suppression signal with a noise suppression controller, and sends the noise suppression signal using a controllable radio frequency amplifier via a transmit antenna, so that the interference signal on a receive antenna of the magnetic resonance tomography scanner is reduced.

20 Claims, 2 Drawing Sheets

DEVICE AND METHOD FOR ACTIVE LOCAL SUPPRESSION OF RECEPTION IN MAGNETIC RESONANCE RECORDINGS

This application claims the benefit of German Patent Application No. DE 10 2020 208 816.0, filed on Jul. 15, 2020, which is hereby incorporated by reference in its entirety.

BACKGROUND

The present embodiments relate to a method for active interference suppression in a magnetic resonance tomography scanner and a magnetic resonance tomography scanner with a receiver.

Magnetic resonance tomography scanners are imaging devices that, in order to map an examination object, align nuclear spins of the examination object with a strong external magnetic field and use a magnetic alternating field to excite the nuclear spins for precession about this alignment. The precession or return of the spins from this excited state into a state with less energy generates, as a response, a magnetic alternating field that is received via antennas.

With the aid of magnetic gradient fields, a spatial encoding is impressed onto the signals, which then makes it possible to assign the received signal to a volume element. The received signal is then evaluated, and a three-dimensional imaging representation of the examination object is provided. In order to receive the signal, local receiving antennas, known as local coils, that are arranged directly on the examination object in order to obtain an improved signal-to-noise ratio may be used. The receiving antennas may also be installed in a patient couch.

Magnetic resonance tomography scanners require radio frequency shielding in two respects. On the one hand, in order to excite the nuclear spins radio frequency pulses with powers in the kilowatt range, which are only partially absorbed in the patient, are generated. Radio waves leaving the patient aperture are radiated into the room and are therefore to be shielded in order to comply with emission limits.

Conversely, the magnetic resonance signals to be received for the imaging are extremely weak. In order to achieve a sufficient signal-to-noise ratio (SNR), external interference signals are to be shielded.

For this reason, in the prior art, costly shielding cabins are installed around a magnetic resonance tomography scanner in order to reduce both emissions and immissions.

The publication PCT/EP2018/076746 discloses a magnetic resonance tomography scanner, in which an interference signal is fed and suppressed in the receiver.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the outlay for interference suppression may be reduced.

One embodiment of a magnetic resonance tomography scanner includes a noise suppressor for suppressing interferences in reception. The noise suppressor has a sensor. A sensor is considered to be a facility that is configured to capture interference signals (e.g., electrical and/or magnetic alternating fields in a frequency range of magnetic resonance signals to be evaluated by the magnetic resonance tomography scanner) and to provide the captured interference signals for a subsequent processing. This may be electrical or magnetic antennas, for example, such as antenna coils or dipoles, monopoles, or multi poles. In one embodiment, the sensor may also include a signal processing such as impedance adjustment, preamplification, filtering, and/or digitization.

The noise suppressor further has a noise suppression controller and a controllable radio frequency amplifier with a signal connection to the noise suppression controller. The noise suppression controller is configured to carry out settings on the controllable radio frequency amplifier, so that this amplifies an input signal as a function of the settings. For example, the settings may predetermine an amplification, a phase shift, and/or a frequency response of the radio frequency amplifier. The device further has one or more transmit antennas that have a signal connection with the radio frequency amplifier, and are configured to output an output signal of the radio frequency amplifier as an electrical and/or magnetic alternating field. The magnetic resonance tomography scanner also has a receive antenna for receiving a magnetic resonance signal (e.g., a local coil or a body coil).

The noise suppressor is configured to receive an interference signal with the sensor, to determine a noise suppression signal with the noise suppression controller as a function of the interference signal, and to emit the noise suppression signal via the controllable radio frequency amplifier and via the transmit antenna.

In one embodiment, for example, the noise suppression controller may adjust an amplification and phase shift, with which the interference signal received by the sensor is amplified and applied by the radio frequency amplifier and is irradiated via the transmit antenna as a noise suppression signal. In one embodiment, for example, the noise suppression controller may receive the interference signal from the sensor via a signal connection and may set the cited parameters such as amplification, phase, and/or frequency response as a function of the received interference signal. In one embodiment, for example, however, the noise suppression controller itself generates an input signal for the radio frequency amplifier from the received interference signal (e.g., by filtering or phase shift).

The noise suppression controller is configured, for example, to determine the noise suppression signal so that the interference signal on the receive antenna is reduced. For example, the phase and amplitude may be set so that the interference signal and the noise suppression signal emitted via the transmit antenna at least partially cancel one another out as a result of destructive interference on the receive antenna. In one embodiment, the parameters may be optimized based on model calculations of the propagation of the signals due to the geometry, for example. However, it is also possible, for example, for an optimization method to determine the parameters so that the energy of the signals received by the receive antenna is minimized.

In one embodiment, the magnetic resonance tomography scanner with the noise suppressor of one or more of the present embodiments allows the impacts of interference signals also to be reduced without significantly affecting the receive path of the magnetic resonance tomography scanner.

The method of one or more of the present embodiments for operating the magnetic resonance tomography scanner has the act of receiving an interference signal with the sensor by the noise suppressor. As already shown previously, the receiving of an interference signal may be the recording of an electrical and/or magnetic alternating field in the frequency range of the magnetic resonance tomography scanner and provision of the electrical and/or magnetic alternating field for a subsequent processing. The interference signal is output by the sensor as a wired electrical signal or as a digital, electrical, optical or also wireless signal, for example.

In a further act of the method, a noise suppression signal is determined with the noise suppression controller as a function of the interference signal. The noise suppression controller determines the noise suppression signal so that when the noise suppression signal is emitted via the transmit antenna or a plurality of transmit antennas, the interference signal on the receive antenna is reduced. This may be achieved, for example, by a noise suppression signal being generated from the interference signal by parameters such as a specific amplification or damping and/or phase shift. The phase shift and/or amplification may be determined, for example, from a geometry of the magnetic resonance tomography scanner including the relative position of the sensor, transmit antenna, and receive antenna by modeling the propagation. Optimization methods, in which an energy of a signal on the receive antenna is minimized by varying the parameters (e.g., without simultaneously receiving a magnetic resonance signal and excitation pulse) may also be used. With interference sources, which occur at least partially in the same way, parameters may also have been determined at an earlier point in time and only retrieved from the storage device by the noise suppression controller.

The noise suppression signal may be provided from the interference signal, for example, by the noise suppression controller transferring the specific parameters to the controllable radio frequency amplifier and this adjusting a corresponding amplification and phase shift, and applying this to the interference signal received by the sensor. In one embodiment, however, the noise suppression controller itself may apply a signal processing with the specific parameters to the interference signal, for example, and may output this to a signal input of the radio frequency amplifier, for example.

In a further act, the noise suppression signal is emitted with the controllable radio frequency amplifier via the transmit antenna.

The method of the present embodiments shares the advantages of the magnetic resonance tomography scanner of the present embodiments.

In a possible embodiment of the magnetic resonance tomography scanner, the noise suppressor has a plurality of sensors that surround the receive antenna in different spatial directions. The receive antennas are configured to receive a plurality of interference signals, also from different interference sources. Arrays or matrices including a number of antenna elements may also be provided. The noise suppression controller is configured, for example, to determine the noise suppression signal as a function of the plurality of received interference signals. The sensors may be arranged in the space so that at least two antennas are always at a different distance from an interference source. For example, a parameter set including amplification, frequency response, and phase may be provided by the noise suppression controller to each sensor from a storage device or may be determined by optimization methods and adjusted by a sensor in a controllable radio frequency amplifier for each signal input. In one embodiment, however, the noise suppression controller itself may receive the signals of the sensors, and therefrom, with a signal processing, may generate a corresponding input signal for the radio frequency amplifier and output the same hereto.

A plurality of sensors enables an improved noise suppression for a plurality of interference sources at different locations.

In one embodiment of the magnetic resonance tomography device, the transmit antenna has a directive efficiency. A directive efficiency is considered to be when the transmit antenna in a predetermined transmit direction achieves a field intensity for the noise suppression signal to be emitted by the transmit antenna that is higher by more than 3 dB, 6 dB, 12 dB, or 18 dB than in a predetermined shielding direction. In one embodiment, the transmit direction may be directed substantially at the receive antenna. The sensors may be arranged in a shielding direction relative to the transmit antenna. For example, the transmit antenna may be a magnetic or electrical dipole or multipole, a directional antenna, or an antenna array, the transmit direction of which is directed at a patient tunnel of the magnetic resonance tomography scanner, in which the receive antenna is located.

A transmit antenna with directive efficiency may provide for the noise suppression signal to be received by the receive antenna and irradiated to a minimal degree into the surroundings. The reduced radiation into the surroundings facilitates retaining limit values for an emission and avoiding or reducing an unwanted retroactive effect, such as feedback between sensors and transmit antenna.

In one possible embodiment of the magnetic resonance tomography scanner, the transmit antenna or the plurality of transmit antenna is arranged in the vicinity of the receive antenna. For example, the transmit antennas may be arranged at their opening of the patient tunnel.

The arrangement of the transmit antenna in the vicinity of the receive antenna may supplement or complement the directive efficiency by the noise suppression signal being recorded by the receive antenna on account of the field strength dropping rapidly with the distance, and being irradiated less into the surroundings (e.g., in relation to the sensors).

In one embodiment of the magnetic resonance tomography scanner, the controllable radio frequency amplifier of the noise suppressor has a plurality of channels and the noise suppressor has a plurality of transmit antennas. The plurality of channels has a signal connection with in each case at least one transmit antenna, so that in each case, at least one transmit antenna emits one channel of the noise suppression signal. In other words, the radio frequency amplifier is configured to output a plurality of channels of a noise suppression signal, so that these may be irradiated independently of one another via a plurality of transmit antennas, in order to be able to achieve different spatial distributions of the irradiated noise suppression signal. The plurality of transmit antennas, for example, surrounds the receive antenna in different spatial directions in order to reduce interference signals from interference sources in different directions and/or an interference source on different propagation paths on the receive antenna. The noise suppression controller is configured to determine a noise suppression signal with a plurality of components as a function of the interference signal or the interference signals, and to emit the components of the noise suppression signal via the plurality of channels of the controllable radio frequency amplifier and via the plurality of transmit antennas. For example, the noise suppression controller itself may provide the components of the noise suppression signal by signal processing from the signal of the sensor or the plurality of signals of the sensors using phase shift, amplification, filtering, and/or mixing, and forward the same to the radio frequency amplifier. In one embodiment, however, the controllable radio frequency amplifier itself may have an adjustable phase shifter and a mixing matrix in order to provide the components of the noise suppression signal from the signals of the sensors.

In one embodiment, a noise suppression signal with a plurality of components that are amplified via the plurality of channels of the radio frequency amplifier and irradiated via the plurality of transmit antennas, with a number of interference sources in different directions, enables the interference signals at the receive antenna to be better reduced than an individual noise suppression signal.

In one possible embodiment of the magnetic resonance tomography scanner, the magnetic resonance tomography scanner is configured to permit an emission of the noise suppression signal only during reception of a magnetic resonance signal. For example, the noise suppression controller may be connected to a controller of the magnetic resonance tomography scanner, and from this, receive a signal when one of the magnetic resonance tomography scanners receives a magnetic resonance signal, and accordingly activate the provision of the noise suppression signal or the emission via the controllable radio frequency amplifier.

The temporal coordination of the noise suppression signal with the reception of the magnetic resonance signal enables the emission of the noise suppression signal also to be temporally minimized in an environment of the magnetic resonance tomography scanner.

In one possible embodiment of the method, the method further has the act, with which magnetic resonance tomography scanners determine a first transmission function by emitting a test signal via the transmit antenna and receiving the test pulse with the receive antenna for an electromagnetic signal between the transmit antenna and the receive antenna. The noise suppression controller may have a signal connection with a receiver of the magnetic resonance tomography scanner, and herefrom, obtains information about the received test signal, so that damping and phase shift may be determined by the noise suppression controller, for example. In one embodiment, however, the receiver may obtain information about the test signal, and therefrom, with the received test signal, the transmission function may be transmitted from the receiver or a controller of the magnetic resonance tomography scanner and to the noise suppression controller.

The knowledge of a transmission function between the transmit antenna of the noise suppressor and the receive antenna may simplify the determination of the noise suppression signal, by the number of free parameters being reduced by the known transmission function.

In one embodiment of the method, the method further has the act, with which magnetic resonance tomography scanners determine a transmission function between an interference signal received by the sensor and the interference signal received by the receive antenna.

In one embodiment, a damping and phase shift may be determined by autocorrelation between an interference signal received by the sensor and an interference signal received by the receiver. A test transmitter may also send a test signal in the vicinity of the sensor in order to determine the transmission information.

With a known transmission function between the sensor and receive antenna, the interference signal on the receive antenna may be predicted from the interference signal received from the sensor, and thus, a noise suppression signal is easily determined.

DETAILED DESCRIPTION

Figure 1:
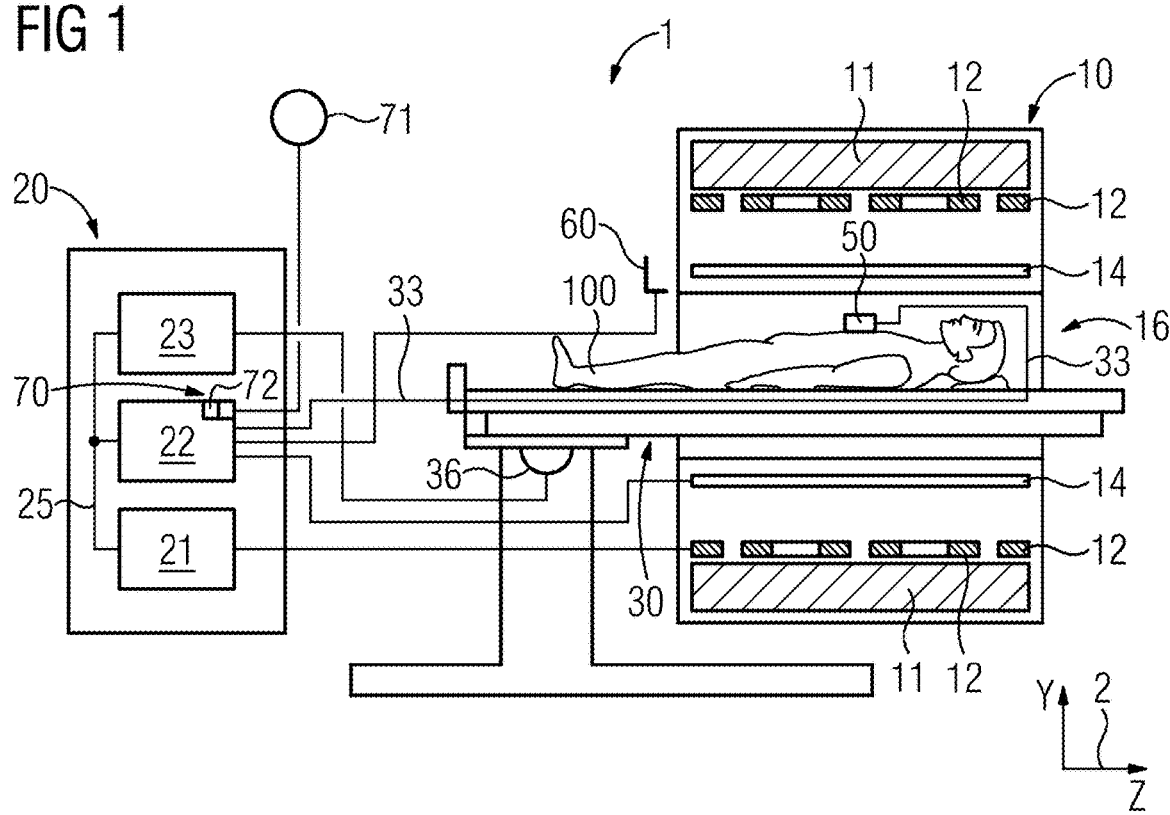
FIG. 1 shows a schematic representation of a magnetic resonance tomography scanner having a noise suppressor according to an embodiment.

FIG. 1 shows a schematic representation of an embodiment of a magnetic resonance tomography scanner 1 with one embodiment of a noise suppressor 70.

The magnet unit 10 has a field magnet 11 that generates a static magnetic field B0 for aligning nuclear spins of samples or of the patient 100 in a recording area. The recording area is characterized by an extremely homogeneous static magnetic field B0, where the homogeneity relates, for example, to the magnetic field strength or the amount. The recording area is almost spherical and arranged in a patient tunnel 16 that extends in a longitudinal direction 2 through the magnet unit 10. A patient couch 30 may be moved in the patient tunnel 16 by the moving unit 36. The field magnet 11 is usually a superconducting magnet that may provide magnetic fields having a magnetic flux density of up to 3T or even higher in the latest equipment. For lower field strengths, however, permanent magnets or electromagnets having normal-conducting coils may also be used.

The magnet unit 10 further includes gradient coils 12 that are configured, for spatial differentiation of the acquired imaging regions in the examination volume, to overlay variable magnetic fields onto the magnetic field B0 in three spatial directions. The gradient coils 12 are typically coils made of normally conducting wires that may generate mutually orthogonal fields in the examination volume.

The magnet unit 10 likewise includes a body coil 14 that is configured to radiate a radio frequency signal supplied via a signal line into the examination volume and to receive resonance signals emitted by the patient 100 and output the signals via a signal line.

A control unit 20 supplies the magnet unit 10 with the different signals for the gradient coils 12 and the body coil 14 and evaluates the received signals.

Accordingly, the control unit 20 has a gradient controller 21 configured to supply the gradient coils 12 via supply lines with variable currents that provide the desired gradient fields in the examination volume in a time-coordinated manner.

Further, the control unit 20 has a radio frequency unit 22 that is configured to generate a radio frequency pulse having a predefined temporal sequence, amplitude, and spectral power distribution for exciting a magnetic resonance of the nuclear spins in the patient 100. Pulse powers in the kilowatt range may be achieved in this case.

The excitation pulses may be radiated into the patient 100 via the body coil 14 or also via a local transmit antenna.

A controller 23 communicates with the gradient controller 21 and the radio frequency unit 22 via a signal bus 25.

A local coil 50 is arranged as a first receive coil on the patient 100 and is connected to the radio frequency unit 22 and a receiver of the radio frequency unit 22 via a connecting lead 33. In one embodiment, the body coil 14 is a first receive antenna within the present embodiments.

The magnetic resonance tomography scanner 1 has a noise suppressor 70 of one or more of the present embodiments. This receives interference signals via a sensor 71 in order to generate a noise suppression signal therefrom with the aid of the noise suppression controller 71, and to send the same with the transmit antenna 60 in the direction of the local coil 50 as a receive antenna, so that the effect of the interference signal is reduced at the site of the local coil 50. The sensor 60 may be arranged at a greater distance from the local coil 50, so that a magnetic resonance signal emitted from the patient tunnel 16 is damped significantly in relation to the interference signal (e.g., by more than 6 dB, 12 dB, 18 dB, 40 dB, or 60 dB), and a magnetic resonance signal is only considered marginally by the noise suppressor 70 to be a perceived interference signal.

Figure 2:
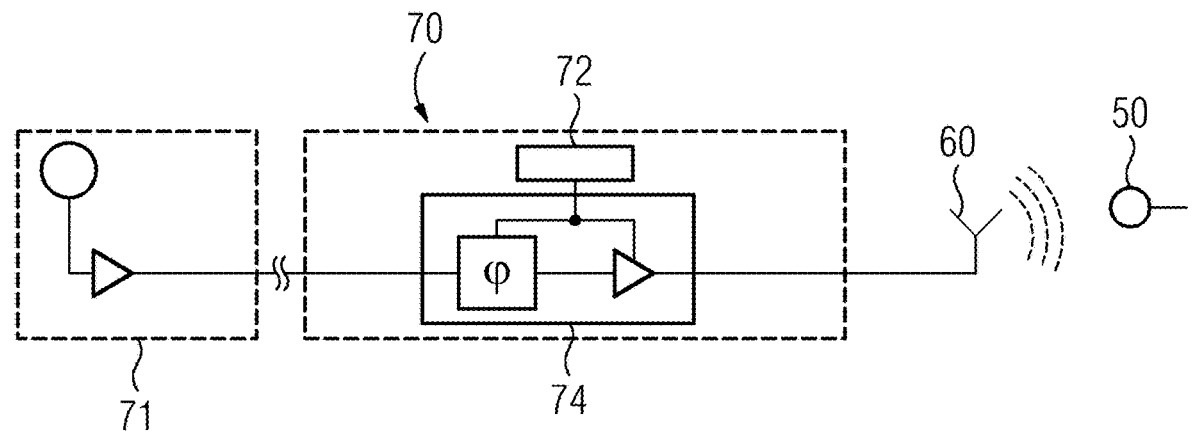
FIG. 2 shows a schematic representation of an embodiment of a noise suppressor in detail.

FIG. 2 shows a schematic representation of a possible embodiment of the noise suppressor in detail.

FIG. 2 only shows a sensor 60. The noise suppressor 70 may have a plurality of sensors 60, however, such as, for example, specified below in FIG. 3).

The sensor 60 has an antenna that converts an electrical and/or magnetic radio-frequency alternating field of an interferer into a current and/or voltage in a conductor. For example, the antenna may be an induction loop. The electrical signal thus generated is typically amplified in the sensor by a low-noise preamplifier (LNA), before being forwarded via a signal connection for further processing in the noise suppressor 70.

An analogue signal processing is shown in, for example, FIG. 2 as an exemplary embodiment. In the controllable radio frequency amplifier, the signal of the sensor 71 is first applied with an adjustable phase shift and then amplified or damped with an adjustable factor, before the signal is output to the transmit antenna 50 for emission. The phase shift and the amplification are set by, for example, the noise suppression controller so that as a result of the destructive interference, the interference signal and noise suppression signal are at least partially canceled at the site of the receive antenna, the local coil 50, and thus the interference effect is reduced. As the parameters amplification and phase shift may be determined, this is then explained below with reference to the method of one or more of the present embodiments relating to FIG. 4.

The transmit antenna 60 is as close as possible in the vicinity of the patient tunnel 16 (e.g., on) or with a number of transmit antennas 60, around the opening. The transmit antenna 60 or the transmit antennas 60 may also have a directive efficiency in the direction of the receive antenna (e.g., a field strength of the emitted noise suppression signal at the same distance from the transmit antenna 60 with the receive antenna has a higher value than in other spatial directions). A directive efficiency may be achieved by multi-element transmit antennas or also by arrays of antennas interconnected with one another.

Figure 3:
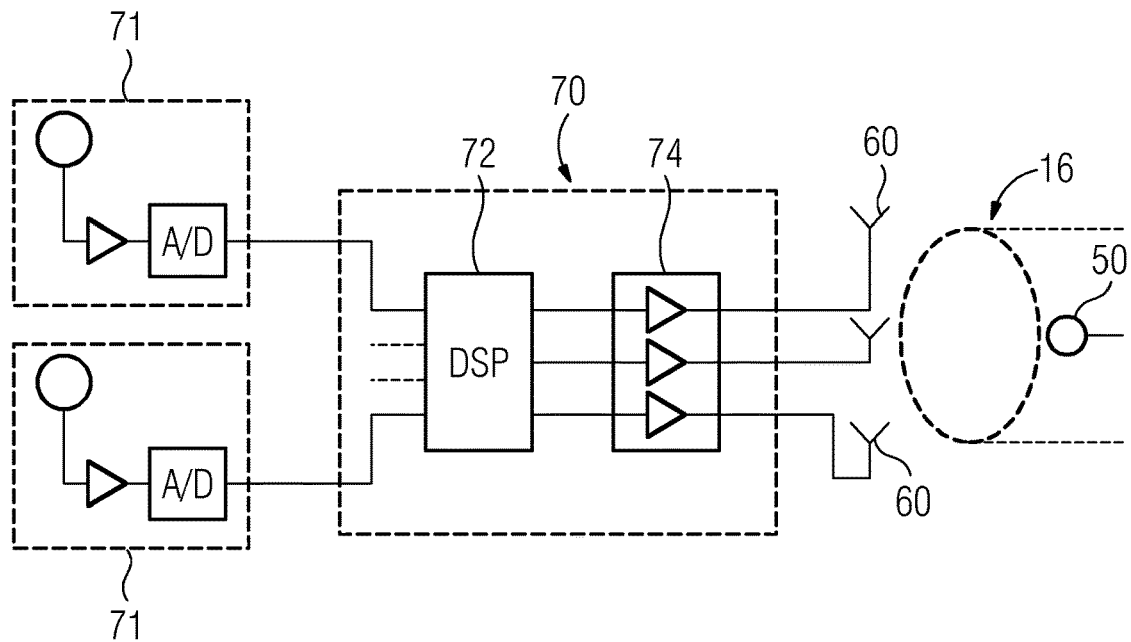
FIG. 3 shows a further embodiment of a noise suppressor.

A further embodiment of the noise suppressor of one or more of the present embodiments is shown in FIG. 3

The embodiment in FIG. 3 differs in that a number of sensors 71 and also a number of transmit antennas 60 are provided. These are distributed as much as possible via different spatial directions with respect to the receive antenna, so that the effect of different interference sources may be optimally suppressed. In order to supply this plurality of transmit antennas 60 with different signals, such as is required to suppress a number of independent interference sources, the controllable radio frequency amplifier 74 has a plurality of independent amplifier channels for amplifying the individual signals.

In the embodiment in FIG. 3, the noise suppression controller 72 has a signal processing resource (e.g., a digital signal processor DSP or an FPGA). In this exemplary embodiment, the sensors 71 already digitize the interference signals and extend to the noise suppression controller 72 in order to provide the noise suppression signals. The noise suppression controller 72 applies the individual interference signals weighted with a phase shift, and mixes the resulting signals to form the noise suppression signals. In one embodiment, however, these acts take place in an analogue signal processing, where the mixture takes place, for example, by a cross-bar matrix with adjustable couplings and phase shift at points of intersection.

Figure 4:
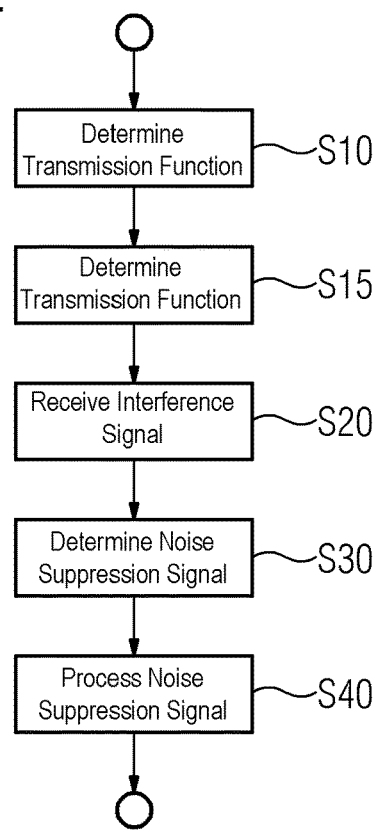
FIG. 4 shows a schematic flow chart for an exemplary embodiment of a method.

FIG. 4 shows a schematic flow chart for an exemplary embodiment of the method.

In act S20, the noise suppressor 70 with the sensor 71 receives an interference signal. As already shown, the interference signal is an electrical and/or magnetic radio-frequency alternating field in a frequency range of the Larmor frequency of the nuclear spins to be captured, which does not originate from the nuclear spins of the object or patient 100 to be examined, however. The reception is carried out in the sensor with an antenna (e.g., a magnetic induction loop or an electrical antenna such as a dipole). The reception includes the conversion into an electrical or optical signal (e.g., with a preamplification and may also contain a digitization). The transmission from the sensor 71 to the noise suppressor 70 may take place via a line or also wirelessly.

In act S30, the noise suppression controller 72 determines a noise suppression signal as a function of the interference signal. The noise suppression signal is determined so that, for example, when the noise suppression signal is emitted via the transmit antenna or the transmit antennas, the interference signal is reduced on the receive antenna. This may take place in a variety of ways. In one embodiment, the noise suppression controller 72 itself may receive the interference signals from the sensor or sensors 71, and may process the interference signals directly with signal processing resources to form a noise suppression signal. It is also possible, however, for the noise suppression controller 72 only to receive the interference signal or signals and therefrom to determine parameters for a subsequent signal processing based on these parameters. The parameters may be implemented in the controllable radio frequency amplifier 74, for example.

Parameters may be an amplification or damping factor, for example, which, applied to the interference signals, provides the noise suppression signal. A phase shift may likewise be provided in order to be able to take into consideration different routes as a result of the relative geometric arrangement of the interference source, sensors 71, transmit antennas 60, and receive antenna or local coil 50, for example. These parameters may also depend in each case on the frequency (e.g., a spectral dependency). With a number m of interference signals and n transmit antennas, one or more parameters may be specified as coefficients of an n×m matrix, in order, for example, to be able to specify in each case the portion of the different interference signals on a noise suppression signal for a transmit antenna 60.

In one embodiment, the parameters may be determined in a variety of ways. If the source of the interference signals is known, for example (e.g., the relative arrangement in relation to the magnetic resonance tomography scanner 1, the sensors 71 and the local coil 50), a phase shift and damping may be determined analytically by simulating the propagation of the interference signals and the noise suppression signal, in which the interference signal and the noise suppression signal or signals almost cancel one another out on the receive antenna. The parameters may, for example, also be stored in the noise suppression controller 72 for known interference sources and removed from the storage device when determined or in each case calculated up-to-date.

In order to respond to variable interferences (e.g., in terms of amplitude, frequency distribution, or in the place of origin), adaptive methods may also be used (e.g., as optimization problem, in which energy of the interference signal on the receive antenna is minimized by the parameters). An algorithm that was operated with artificial intelligence and had been trained with different interference sources may be used.

In act S40, the determined noise suppression signal is processed with the controllable radio frequency amplifier 74 (e.g., amplified inter alia according to the parameters and emitted by way of the transmit antenna 60). Depending on whether the noise suppression controller 72 has already processed the noise suppression signal/signals or has only determined the parameters, act S40 may also involve applying the predetermined parameters, such as phase shifts and/or different mixture and amplification ratios and frequency responses, as part of the controllable radio frequency amplifier or an upstream signal processing resource.

The determination of the noise suppression signals may be simplified and/or improved significantly if the number of unknowns is reduced. Provision may therefore be made in act S10 of the method of one or more of the present embodiments for the magnetic resonance tomography scanner 1 to determine a transmission function by emitting a test signal via the transmit antenna 60 and receiving the test pulse with the receive antenna or local coil 50 (e.g., a first transmission function for an electromagnetic signal between the transmit antenna 60 and the receive antenna). Act S10 may be executed again in each case by the control unit 20 of the magnetic resonance tomography scanner 1 if a new patient 100 is examined or the position of the patient is changed with the patient couch 30.

In one embodiment of the method, additionally or alternatively, the magnetic resonance tomography scanner 1, in act S15, may determine a transmission function between an interference signal received by the sensor and the interference signal received by the receive antenna. In one embodiment, for example, this transmission function may be determined by autocorrelation with an interference signal.

Although the invention has been illustrated and described in greater detail with the preferred exemplary embodiment, the invention is not restricted by the examples disclosed and other variations can be derived therefrom by the person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography scanner comprising:
a noise suppressor configured to suppress receive interferences, wherein the noise suppressor comprises:
a sensor;
a noise suppression controller;
a controllable radio frequency amplifier in signal connection with the noise suppression controller; and
a transmit antenna;
a receive antenna configured to receive a magnetic resonance signal,
wherein the noise suppressor is configured to:
receive an interference signal with the sensor;
determine a noise suppression signal with the noise suppression controller as a function of the interference signal; and
emit the noise suppression signal via the controllable radio frequency amplifier and via the transmit antenna, and
wherein the noise suppression controller is configured to determine the noise suppression signal so that the interference signal on the receive antenna is reduced.

2. The magnetic resonance tomography scanner of claim 1, wherein the noise suppressor further comprises a plurality of sensors that surround the receive antenna in different spatial directions and are configured to receive a plurality of interference signals, and
wherein the noise suppression controller is configured to determine the noise suppression signal as a function of the plurality of received interference signals.

3. The magnetic resonance tomography scanner of claim 2, wherein the transmit antenna is arranged in the vicinity of the receive antenna.

4. The magnetic resonance tomography scanner of claim 2, wherein the controllable radio frequency amplifier has a plurality of channels, and the noise suppressor comprises a plurality of transmit antennas that surround the receive antenna in different spatial directions, and
wherein the noise suppression controller is configured to:
determine the noise suppression signal with a plurality of components as a function of the interference signal; and
emit the plurality of components of the noise suppression signal via the plurality of channels of the controllable radio frequency amplifier and via the plurality of transmit antennas.

5. The magnetic resonance tomography scanner of claim 2, wherein the magnetic resonance tomography scanner is configured to permit an emission of the noise suppression signal only during a reception of a magnetic resonance signal.

6. The magnetic resonance tomography scanner of claim 1, wherein the transmit antenna has a directive efficiency.

7. The magnetic resonance tomography scanner of claim 6, wherein the transmit antenna is arranged in the vicinity of the receive antenna.

8. The magnetic resonance tomography scanner of claim 6, wherein the controllable radio frequency amplifier has a plurality of channels, and the noise suppressor comprises a plurality of transmit antennas that surround the receive antenna in different spatial directions, and
wherein the noise suppression controller is configured to:
determine the noise suppression signal with a plurality of components as a function of the interference signal; and
emit the plurality of components of the noise suppression signal via the plurality of channels of the controllable radio frequency amplifier and via the plurality of transmit antennas.

9. The magnetic resonance tomography scanner of claim 6, wherein the magnetic resonance tomography scanner is configured to permit an emission of the noise suppression signal only during a reception of a magnetic resonance signal.

10. The magnetic resonance tomography scanner of claim 1, wherein the transmit antenna is arranged in the vicinity of the receive antenna.

11. The magnetic resonance tomography scanner of claim 10, wherein the controllable radio frequency amplifier has a plurality of channels, and the noise suppressor comprises a plurality of transmit antennas that surround the receive antenna in different spatial directions, and
wherein the noise suppression controller is configured to:
determine the noise suppression signal with a plurality of components as a function of the interference signal; and
emit the plurality of components of the noise suppression signal via the plurality of channels of the controllable radio frequency amplifier and via the plurality of transmit antennas.

12. The magnetic resonance tomography scanner of claim 10, wherein the magnetic resonance tomography scanner is configured to permit an emission of the noise suppression signal only during a reception of a magnetic resonance signal.

13. The magnetic resonance tomography scanner of claim 1, wherein the controllable radio frequency amplifier has a plurality of channels, and the noise suppressor comprises a plurality of transmit antennas that surround the receive antenna in different spatial directions, and
wherein the noise suppression controller is configured to:
determine the noise suppression signal with a plurality of components as a function of the interference signal; and
emit the plurality of components of the noise suppression signal via the plurality of channels of the controllable radio frequency amplifier and via the plurality of transmit antennas.

14. The magnetic resonance tomography scanner of claim 13, wherein the magnetic resonance tomography scanner is configured to permit an emission of the noise suppression signal only during a reception of a magnetic resonance signal.

15. The magnetic resonance tomography scanner of claim 1, wherein the magnetic resonance tomography scanner is configured to permit an emission of the noise suppression signal only during a reception of a magnetic resonance signal.

16. A method for operating a magnetic resonance tomography scanner with a noise suppressor, wherein the noise suppressor includes a sensor, a noise suppression controller, a controllable radio frequency amplifier in signal connection with the noise suppression controller, and a transmit antenna, wherein the magnetic resonance tomography scanner includes a receive antenna for receiving a magnetic resonance signal, the method comprising:
receiving an interference signal with the sensor using the noise suppressor;
determining a noise suppression signal with the noise suppression controller as a function of the interference signal so that when the noise suppression signal is emitted, the interference signal on the receive antenna is reduced; and
emitting the noise suppression signal with the controllable radio frequency amplifier via the transmit antenna.

17. The method of claim 16, further comprising determining, by the magnetic resonance tomography scanner, a transfer function for an electromagnetic signal between the transmit antenna and the receive antenna, the determining of the transfer function comprising emitting a test signal via the transmit antenna and receiving the test signal with the receive antenna.

18. The method of claim 16, further comprising determining, by the magnetic resonance tomography scanner, a transfer function between the interference signal received by the sensor and an interference signal received by the receive antenna.

19. The method of claim 16, further comprising:
determining, by the magnetic resonance tomography scanner, a first transfer function between the interference signal received by the sensor and an interference signal received by the receive antenna; and
determining, by the magnetic resonance tomography scanner, a second transfer function for an electromagnetic signal between the transmit antenna and the receive antenna, the determining of the second transfer function comprising emitting a test signal via the transmit antenna and receiving the test signal with the receive antenna,
wherein determining the noise suppression signal comprises determining the noise suppression signal based on the first transfer function and the second transfer function.

20. A magnetic resonance tomography scanner comprising:
a noise suppressor configured to suppress receive interferences, wherein the noise suppressor comprises:
a sensor;
a noise suppression controller;
a controllable radio frequency amplifier in signal connection with the noise suppression controller; and
a transmit antenna;
a receive antenna configured to receiver a magnetic resonance signal,
wherein the noise suppressor is configured to:
receive an interference signal with the sensor;
determine a noises suppression signal with the noise suppression controller as a function of the interference signal; and
emit the noises suppression signal via the controllable radio frequency amplifier and via the transmit antenna, and
wherein the noise suppression controller is configured to determine the noise suppression signal so that the interference signal on the receive antenna is reduced, and
wherein the transmit antenna has a directive efficiency.

* * * * *